(12) United States Patent
Chou

(10) Patent No.: US 8,072,060 B2
(45) Date of Patent: Dec. 6, 2011

(54) SEMICONDUCTOR FINGERPRINT APPARATUS WITH FLAT TOUCH SURFACE

(75) Inventor: Bruce C. S. Chou, Hsin Chu (TW)

(73) Assignee: Egis Technology Inc., Taipei (TW)

( * ) Notice: Subject to any disclaimer, the term of this patent is extended or adjusted under 35 U.S.C. 154(b) by 280 days.

(21) Appl. No.: 12/578,937

(22) Filed: Oct. 14, 2009

(65) Prior Publication Data
US 2010/0096710 A1 Apr. 22, 2010

(30) Foreign Application Priority Data
Oct. 17, 2008 (TW) ................................. 97139826 A

(51) Int. Cl.
H01L 23/04 (2006.01)
H01L 23/053 (2006.01)
H01L 23/12 (2006.01)
H01L 23/48 (2006.01)
H01L 23/52 (2006.01)
H01L 29/40 (2006.01)

(52) U.S. Cl. . 257/698; 257/700; 257/774; 257/E21.597; 257/E23.011

(58) Field of Classification Search ................ 257/698, 257/700, 774, E21.597, E23.011
See application file for complete search history.

(56) References Cited

U.S. PATENT DOCUMENTS

| | | | |
|---|---|---|---|
| 4,053,228 A | 10/1977 | Schiller | |
| 4,340,300 A | 7/1982 | Ruell | |
| 4,577,345 A * | 3/1986 | Abramov | 382/124 |
| 5,429,006 A * | 7/1995 | Tamori | 73/862.046 |
| 5,757,278 A * | 5/1998 | Itsumi | 340/5.83 |
| 6,234,031 B1 * | 5/2001 | Suga | 73/862.474 |
| 6,327,376 B1 * | 12/2001 | Harkin | 382/124 |
| 6,512,381 B2 * | 1/2003 | Kramer | 324/658 |
| 7,629,200 B2 * | 12/2009 | Miyai et al. | 438/106 |
| 7,907,127 B2 * | 3/2011 | Gillespie et al. | 345/174 |
| 7,915,601 B2 * | 3/2011 | Setlak et al. | 250/556 |
| 2004/0188838 A1 * | 9/2004 | Okada et al. | 257/738 |
| 2006/0108686 A1 * | 5/2006 | Okada | 257/738 |
| 2008/0258580 A1 * | 10/2008 | Schneider et al. | 310/334 |
| 2009/0273570 A1 * | 11/2009 | Degner et al. | 345/173 |

\* cited by examiner

Primary Examiner — Ida M Soward
(74) Attorney, Agent, or Firm — Muncy, Geissler, Olds & Lowe, PLLC

(57) ABSTRACT

In a fingerprint apparatus, fingerprint sensing members disposed on a silicon substrate detect skin textures of a finger placed thereon to generate electric signals. A set of integrated circuits formed on the substrate processes the electric signals. First bonding pads are disposed on the substrate and electrically connected to the set of integrated circuits. A first insulating layer is disposed below the first bonding pads. Metal plugs penetrating through the substrate are respectively electrically connected to the first bonding pads. A second insulating layer is formed on the substrate and between the metal plugs and the substrate. Second bonding pads are formed on a rear side of the second insulating layer, and are respectively electrically connected to the first bonding pads through the metal plugs. The protection layer is disposed on the substrate and covers the sensing members to form a flat touch surface to be touched by the finger.

12 Claims, 8 Drawing Sheets

SEMICONDUCTOR FINGERPRINT APPARATUS WITH FLAT TOUCH SURFACE

This application claims priority of No. 097139826 filed in Taiwan R.O.C. on Oct. 17, 2008 under 35 USC 119, the entire content of which is hereby incorporated by reference.

BACKGROUND OF THE INVENTION

1. Field of the Invention

The invention relates to a fingerprint apparatus, and more particularly to a semiconductor fingerprint apparatus with a flat touch surface.

2. Related Art

There are many known techniques of identifying an individual through the identification of the individual's fingerprint. The use of an ink pad and the direct transfer of ink by the thumb or finger from the ink pad to a recording card is the standard way of making this identification. Then, an optical scanner scans the recording card to get an image, which is then compared to fingerprint images in the computer database. However, the worst drawback of the above-mentioned method is that the fingerprint identification cannot be processed in real-time, and thus cannot satisfy the requirement of real-time authentication, such as network authentication, e-business, portable electronics products, personal ID card, security system, and the like.

The method for reading a fingerprint in real-time has become the important technology in the biometrics market. Conventionally, an optical fingerprint sensor may be used to read a fingerprint in real-time, as disclosed in U.S. Pat. Nos. 4,053,228 and 4,340,300. However, the optical fingerprint sensor has drawbacks because it is large in size and tends to be cheated by the fake image.

Consequently, silicon fingerprint sensors, which overcome the drawbacks of the optical sensor and are formed by silicon semiconductor technology, are developed. Based on the consideration of the manufacturing processes of the silicon integrated circuit, the capacitive or other electric field fingerprint sensor chip has become the most direct and simplest way.

FIG. 1 is a schematic illustration showing a conventional fingerprint apparatus 100. Referring to FIG. 1, the silicon semiconductor fingerprint apparatus 100 includes a package substrate 110, a fingerprint sensor 120, a plurality of interconnection wires 130 and an encapsulation layer 140. The fingerprint sensor 120 is disposed on the package substrate 110. The interconnection wires 130 electrically connect bonding pads 122 of the fingerprint sensor 120 to bonding pads 112 of the package substrate 110.

For application, the fingerprint apparatus has an exposed surface to be touched by the finger to sense the image of the finger textures. To achieve that, during the packaging process, a special mold and a flexible, soft material layer have to be adopted to protect the sensing surface of the fingerprint sensing chip, and two sides or the periphery of the packaged product are always higher than the middle sensing surface, as shown in FIG. 1.

According to the above-mentioned reasons, the conventional fingerprint apparatus has the high package cost and needs the special machine. In addition, because the external surface of the fingerprint sensing chip has to be exposed, the abilities of withstanding the electrostatic discharge and the force impact are deteriorated. Thus, the inconvenience of using the product is caused, and the lifetime of the product is shortened.

FIG. 2 is a schematic illustration showing the application of the fingerprint apparatus 100 of FIG. 1. As shown in FIG. 2, the fingerprint apparatus 100 is mounted on a notebook computer to serve as an apparatus for sensing the fingerprint and controlling the cursor to move on a screen by sensing the motion of the finger. Because the upper surface of the fingerprint sensor of FIG. 1 does not have an entirely flat touch surface, a special slide way 200 has to be formed on the notebook computer. Nevertheless, the swiping motions of the finger, especially the swiping motions along the left and right directions of FIG. 1, are still restricted by the projections on two sides. Thus, the user cannot control the mouse cursor at his or her will smoothly.

Therefore, it is an important subject to provide a semiconductor fingerprint apparatus with a flat touch surface but without the needs of the special mold and the conventional package.

SUMMARY OF THE INVENTION

It is therefore an object of the invention to provide a semiconductor fingerprint apparatus with a completely flat touch surface and the size that may be effectively reduced.

To achieve the above-identified object, the invention provides a semiconductor fingerprint apparatus including a silicon substrate, a plurality of fingerprint sensing members, a set of integrated circuits, a plurality of first bonding pads, a first insulating layer, a plurality of metal plugs, a second insulating layer, a plurality of second bonding pads and a protection layer. The silicon substrate has a front side and a rear side. The fingerprint sensing members, disposed on the front side of the silicon substrate, detect skin textures of a finger placed on the fingerprint sensing members and thus generate a plurality of electric signals. The set of integrated circuits is formed on the front side of the silicon substrate and processes the electric signals. The first bonding pads are disposed on the front side of the silicon substrate and electrically connected to the set of integrated circuits. The first insulating layer is disposed below the first bonding pads. The metal plugs penetrate through the silicon substrate and the first insulating layer and are electrically connected to the first bonding pads, respectively. The second insulating layer is formed on the rear side of the silicon substrate and between the metal plugs and the silicon substrate. The second bonding pads are formed on a rear side of the second insulating layer. The second bonding pads are electrically connected to the first bonding pads through the metal plugs, respectively. The protection layer, disposed on the front side of the silicon substrate and covering the fingerprint sensing members, forms a flat touch surface to be touched by the finger.

According to the fingerprint apparatus of the invention, it is possible to effectively simplify the industrial design so that the operation of the user cannot be further restricted, and the size and the area of the fingerprint apparatus can be effectively reduced.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

Figure 1:
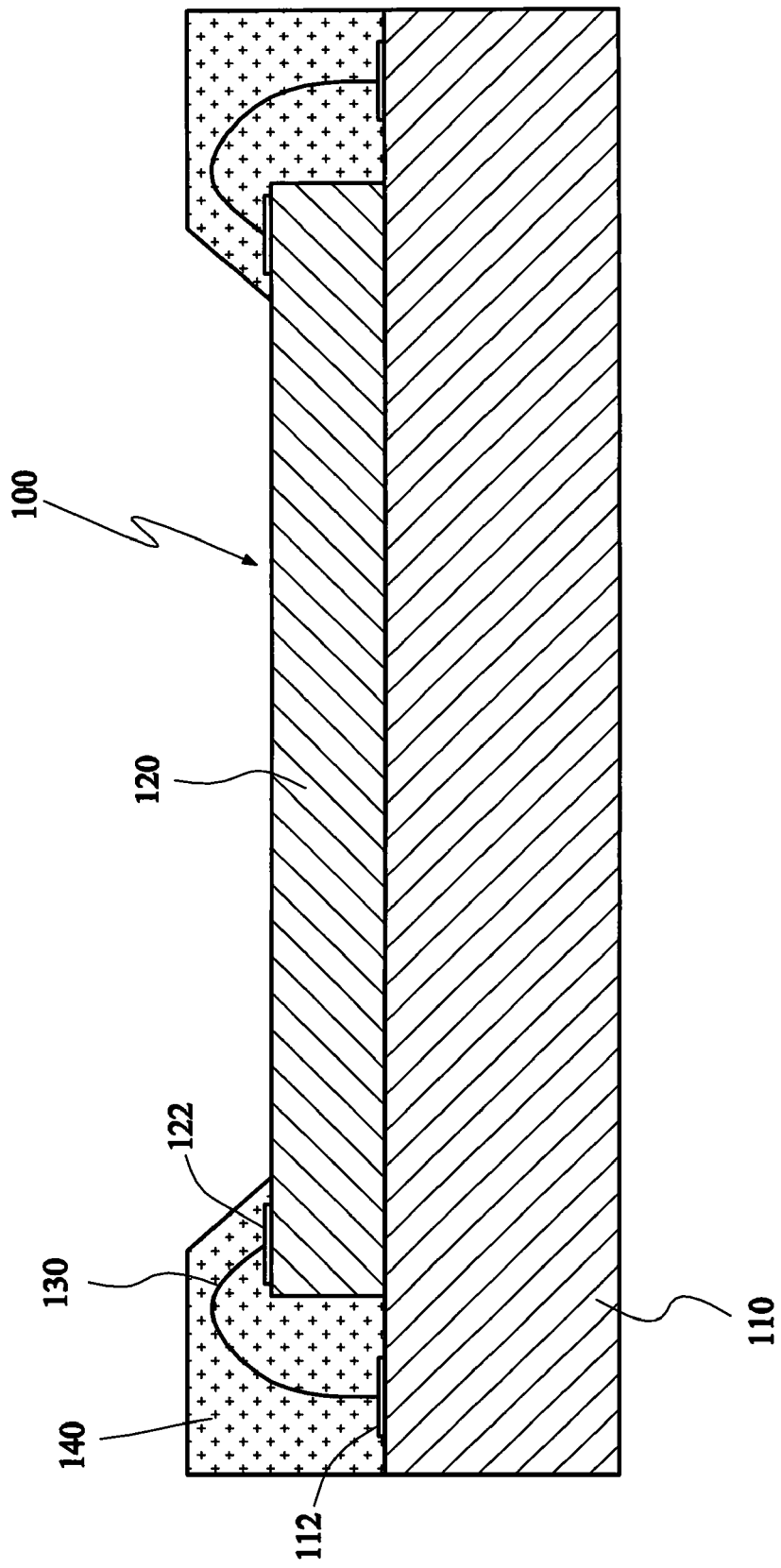
FIG. 1 is a schematic illustration showing a conventional fingerprint apparatus.
Figure 2:
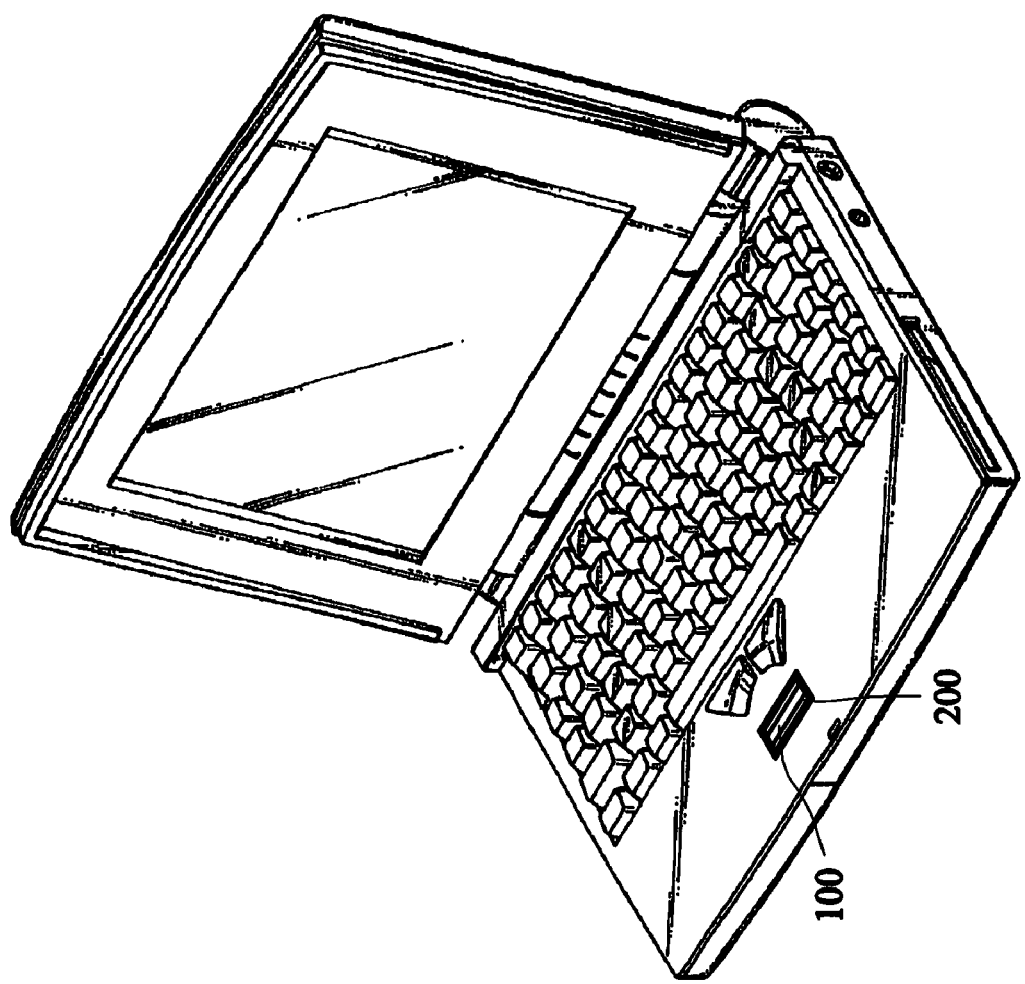
FIG. 2 is a schematic illustration showing the application of the fingerprint apparatus of FIG. 1.
Figure 3:
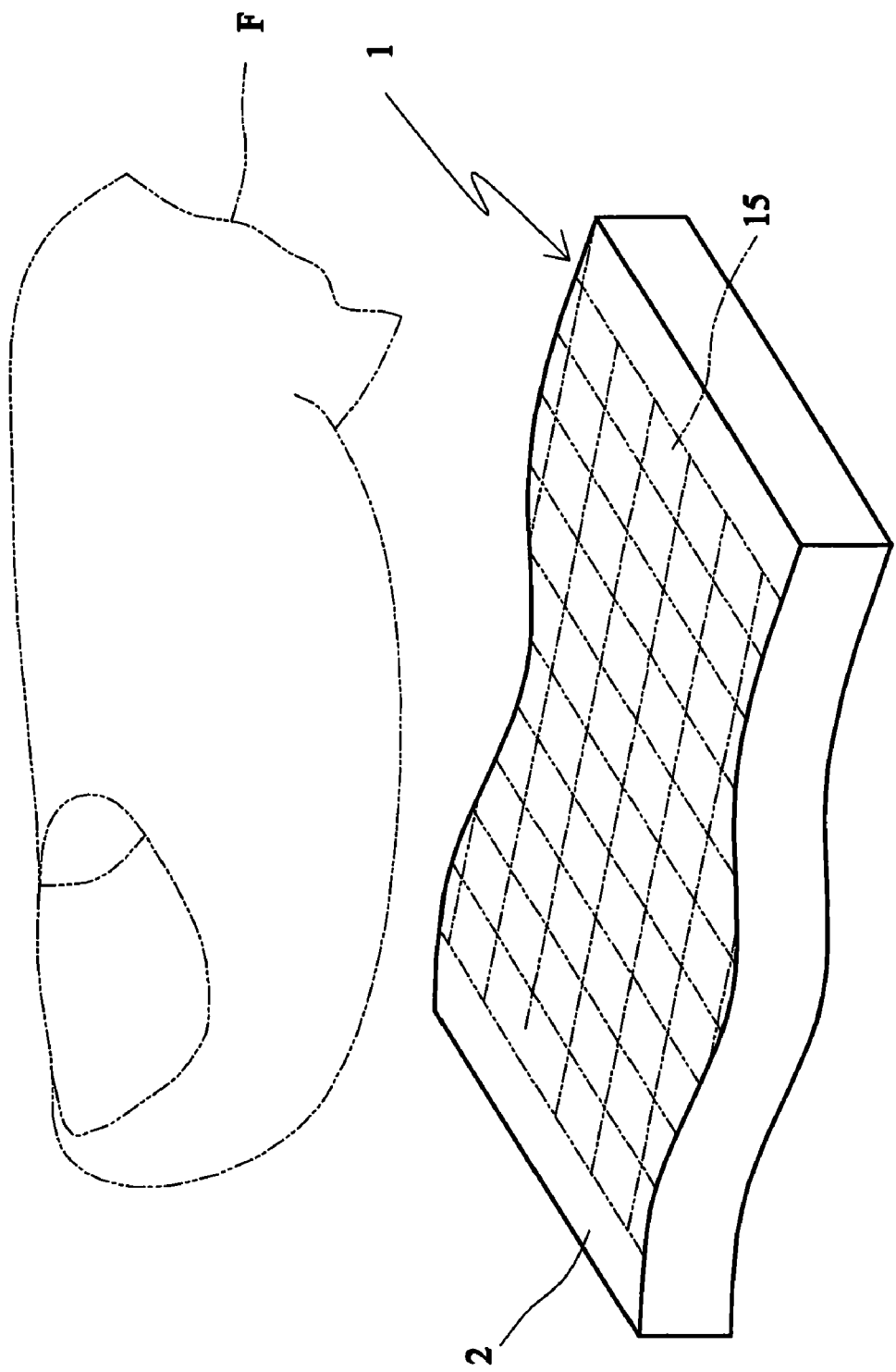
FIG. 3 is a partially pictorial view showing a fingerprint apparatus according to a first embodiment of the invention.
Figure 4:
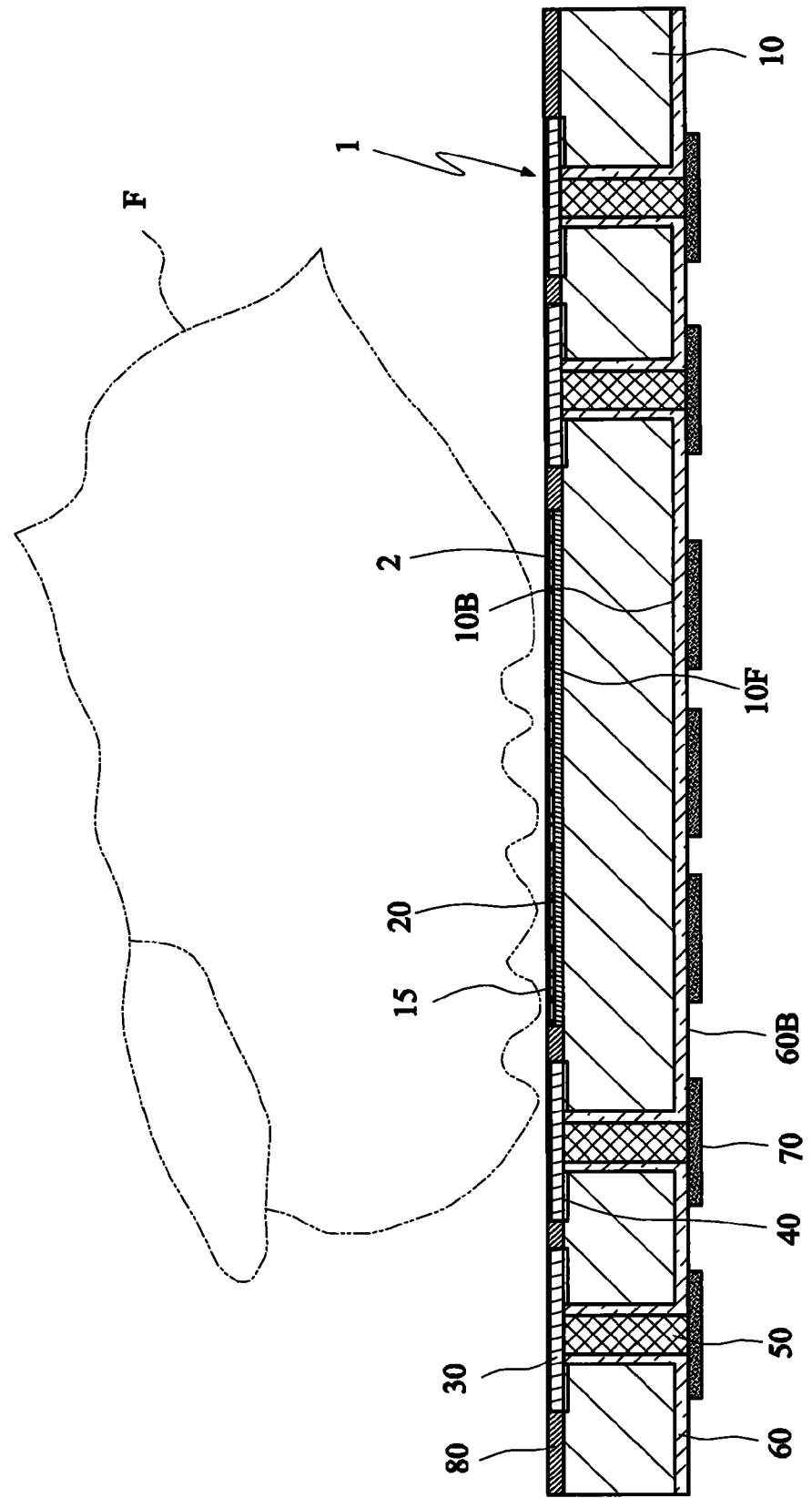
FIG. 4 is a pictorial view showing the fingerprint apparatus according to the first embodiment of the invention.

FIG. 3 is a partially pictorial view showing a fingerprint apparatus 1 according to a first embodiment of the invention. FIG. 4 is a pictorial view showing the fingerprint apparatus 1 according to the first embodiment of the invention. Referring to FIGS. 3 and 4, the semiconductor fingerprint apparatus 1 of this embodiment includes a silicon substrate 10, a plurality of fingerprint sensing members 15, a set of integrated circuits 20, a plurality of first bonding pads 30, a first insulating layer 40, a plurality of metal plugs 50, a second insulating layer 60, a plurality of second bonding pads 70 and a protection layer 80.

The silicon substrate 10 has a front side 10F and a rear side 10B. The fingerprint sensing members 15 are disposed on the front side 10F of the silicon substrate 10, and for detecting skin textures of a finger F placed on the fingerprint sensing members 15 and thus generating a plurality of electric signals. The set of integrated circuits 20 is formed on the front side 10F of the silicon substrate 10 and processes the electric signals. The first bonding pads 30 are disposed on the front side 10F of the silicon substrate 10, and electrically connected to the set of integrated circuits 20. The set of integrated circuits 20 may be entirely or partially formed under or around the fingerprint sensing members 15.

The first insulating layer 40 is disposed below the first bonding pads 30. In this embodiment, the material of the first insulating layer 40 includes silicon dioxide, any other dielectric material or any other polymeric insulation material.

The metal plugs 50 penetrate through two surfaces of the silicon substrate 10 and the first insulating layer 40, and are respectively electrically connected to the first bonding pads 30. In detail, the metal plugs 50 are partially or fully filled into via holes formed below the first metallic bonding pads 30.

The second insulating layer 60 is formed on the rear side 10B of the silicon substrate 10, and the sidewalls between the metal plugs 50 and the silicon substrate 10. The material of the second insulating layer 60 includes silicon dioxide, any other dielectric material or any other polymeric insulation material. The second bonding pads 70 are formed on a rear side 60B of the second insulating layer 60 and are respectively electrically connected to the first bonding pads 30 through the metal plugs 50. The electrical connection medium may include a plurality of interconnections, which is formed on the second insulating layer 60 by the standard semiconductor manufacturing technology.

The protection layer 80 is disposed on the front side 10F of the silicon substrate 10 and covers the fingerprint sensing members 15 to form a flat touch surface 2 to be touched by the finger F. The protection layer 80 may further partially cover or entirely cover the set of integrated circuits 20 and the first bonding pads 30. In order to prevent the latent fingerprint or the moisture from remaining thereon, the material of the protection layer, such as any one selected from some nano-polymeric materials or ceramics materials, may further have the hydrophobic and lipophobic (oleophobic) properties. In this embodiment, the material of the protection layer includes polyimide, epoxy resin or diamond-like carbon (DLC), and the contact angle between the material and water is preferably greater than 60 degrees.

Figure 5:
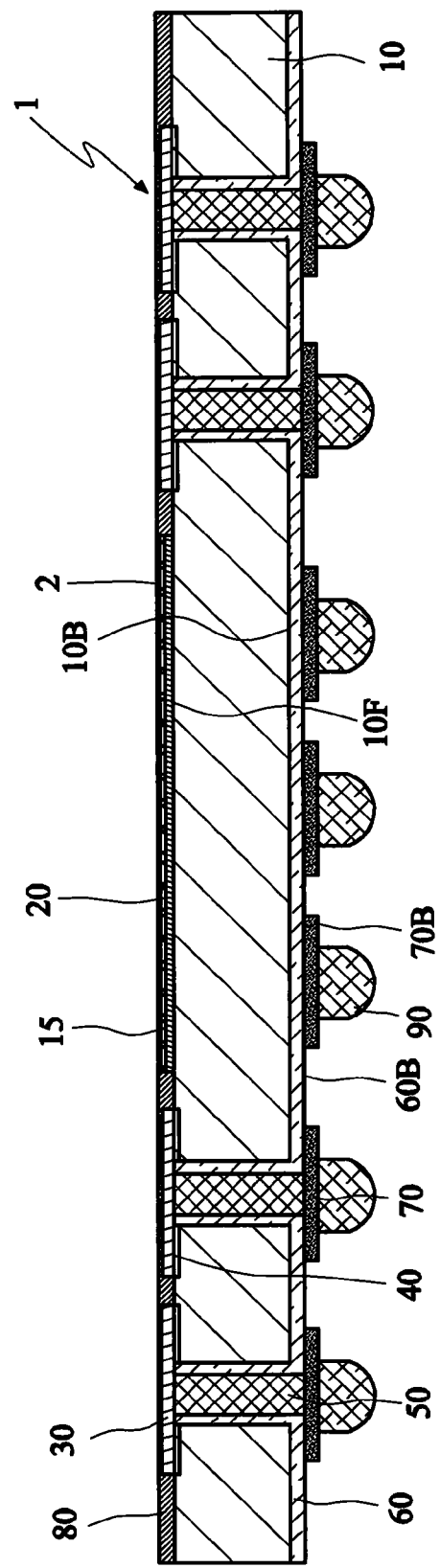
FIG. 5 is a pictorial view showing a fingerprint apparatus according to a second embodiment of the invention.

FIG. 5 is a pictorial view showing a fingerprint apparatus according to a second embodiment of the invention. As shown in FIG. 5, the second embodiment is similar to the first embodiment except that the semiconductor fingerprint apparatus 1 according to the second embodiment of the invention further includes a plurality of solder bumps 90 respectively electrically connected to the second bonding pads 70 and disposed on rear sides 70B of the second bonding pads 70.

Figure 6:
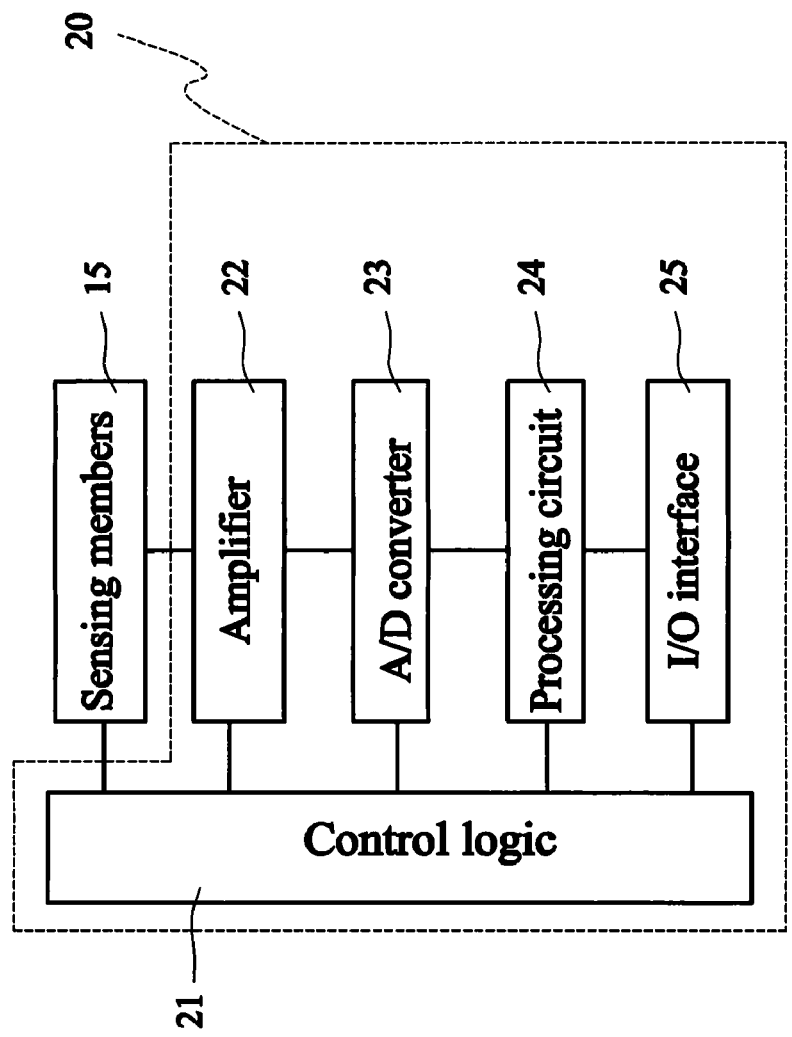
FIG. 6 is a block diagram showing an integrated circuit according to each embodiment of the invention.

FIG. 6 is a block diagram showing an integrated circuit according to each embodiment of the invention. Referring to FIG. 6, the set of integrated circuits 20 includes an amplifier 22, an analog-to-digital (A/D) converter 23, a processing circuit 24, an input/output (I/O) interface 25 and a control logic 21. The amplifier 22 electrically connected to the fingerprint sensing members 15 amplifies the electric signals outputted from the fingerprint sensing members 15. The analog-to-digital converter 23 electrically connected to the amplifier 22 converts the analog electric signals into digital signals. The processing circuit 24 electrically connected to the analog-to-digital converter 23 processes the digital signals. The processing circuit 24 mainly functions to pre-process the inputted digital signals, such as to enhance the contrast quality of the image, to correlate the continuously outputted signals, or to accumulate multiple fragment images into a complete fingerprint image. The input/output interface 25 electrically connected to the processing circuit 24 outputs the processed digital signals. The control logic 21, electrically connected to the fingerprint sensing members 15, the amplifier 22, the analog-to-digital converter 23, the processing circuit 24 and the input/output interface 25, controls the fingerprint sensing members 15, the amplifier 22, the analog-to-digital converter 23, the processing circuit 24 and the input/output interface 25 to operate.

Figure 7:
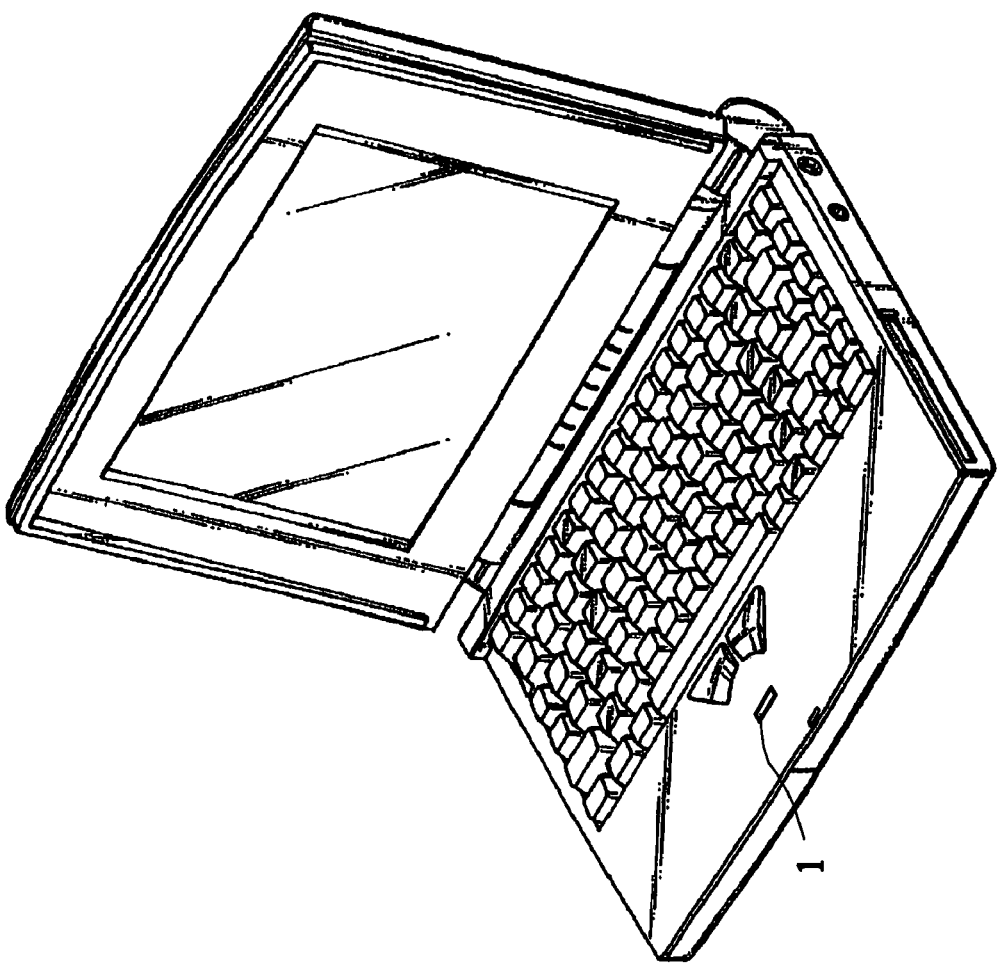
FIG. 7 is a schematic illustration showing an application of the fingerprint apparatus according to each embodiment of the invention.

FIG. 7 is a schematic illustration showing an application of the fingerprint apparatus according to each embodiment of the invention. As shown in FIG. 7, the fingerprint apparatus is mounted on a notebook computer. Because the fingerprint apparatus has the fully flat sensing surface, it is unnecessary to form a special slide way on the stage of the notebook computer, and the swiping direction of the finger won't be restricted to cause the non-smooth movement.

Figure 8:
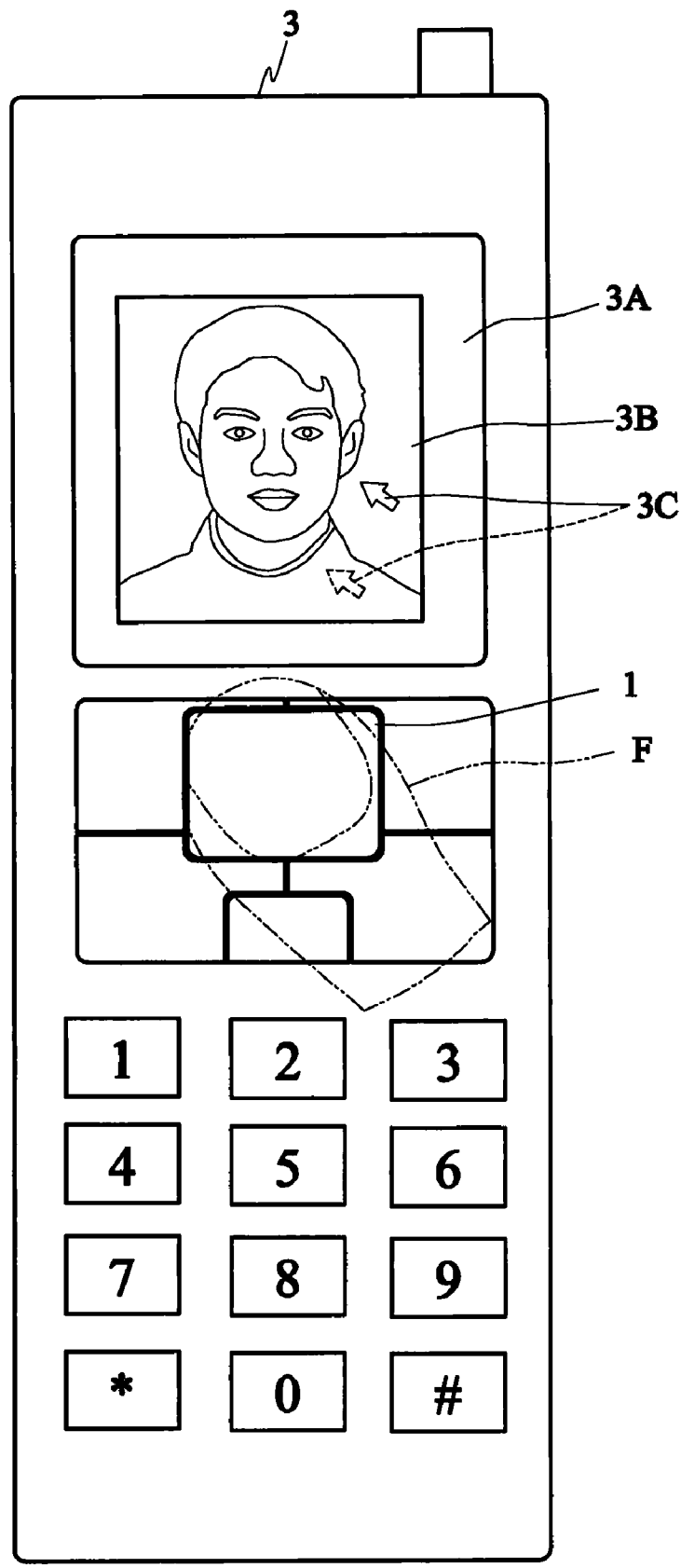
FIG. 8 is a schematic illustration showing another application of the fingerprint apparatus according to each embodiment of the invention.

FIG. 8 is a schematic illustration showing another application of the fingerprint apparatus according to each embodiment of the invention. As shown in FIG. 8, the fingerprint apparatus 1 may also be mounted on a mobile telephone 3 to provide the navigation function of a cursor 3B on a display 3A. The swiping of the finger F may move the cursor 3B and turns the cursor 3B into the cursor 3C. So, the fingerprint apparatus needs not to have the special slide way, and the finger can freely swipe or move in any direction.

Another advantage of the apparatus of the invention will be described in the following. When the apparatus of the invention is mounted on a printed circuit board (PCB), the area occupied thereby is relatively small and is substantially equal to the actual area of the overall sensing chip circuit. This is very important to the miniaturized electronic product design. In brief, the front side of the silicon substrate is designed as the sensing surface to be touched by the finger according to the metal plugs, and the rear side of the silicon substrate serves as a contact surface to be directly or indirectly assembled with the PCB. Thus, the apparatus of the invention is very suitable for the application of the small-sized electronic apparatus (e.g., a mobile telephone).

Therefore, the fingerprint apparatus of the invention has the following advantages. First, the industrial design of the fingerprint apparatus can be effectively simplified. Second, the fully flat surface of the fingerprint apparatus makes the user's operation become smooth and non-restrictive. Third, the size and the area of the fingerprint apparatus can be effectively reduced. Fourth, the wafer scale package of the sensor device may be achieved using the metal plugs without the need of the conventional mold package, which wastes a lot of materials and costs.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A semiconductor fingerprint apparatus, comprising:
 a silicon substrate having a front side and a rear side;
 a plurality of fingerprint sensing members, disposed on the front side of the silicon substrate, for detecting skin textures of a finger placed on the fingerprint sensing members and thus generating a plurality of electric signals;
 a set of integrated circuits, formed on the front side of the silicon substrate, for processing the electric signals;
 a plurality of first bonding pads disposed on the front side of the silicon substrate and electrically connected to the set of integrated circuits;
 a first insulating layer disposed below the first bonding pads;
 a plurality of metal plugs penetrating through the silicon substrate and the first insulating layer and electrically connected to the first bonding pads, respectively;
 a second insulating layer formed on the rear side of the silicon substrate and between the metal plugs and the silicon substrate;
 a plurality of second bonding pads formed on a rear side of the second insulating layer, wherein the second bonding pads are electrically connected to the first bonding pads through the metal plugs, respectively; and
 a protection layer, disposed on the front side of the silicon substrate and covering the fingerprint sensing members, for forming a flat touch surface to be touched by the finger.

2. The apparatus according to claim 1, further comprising:
 a plurality of solder bumps receptively electrically connected to the second bonding pads and disposed on a plurality of rear sides of the second bonding pads.

3. The apparatus according to claim 1, wherein the protection layer further covers the set of integrated circuits and the first bonding pads.

4. The apparatus according to claim 3, wherein the protection layer entirely covers the set of integrated circuits and the first bonding pads.

5. The apparatus according to claim 1, wherein a material of the first insulating layer comprises silicon dioxide, a dielectric material or a polymeric insulation material.

6. The apparatus according to claim 1, wherein a material of the second insulating layer comprises silicon dioxide, a dielectric material or a polymeric insulation material.

7. The apparatus according to claim 1, wherein a material of the second insulating layer comprises a polymeric material.

8. The apparatus according to claim 1, wherein the set of integrated circuits comprises:
 an amplifier electrically connected to the fingerprint sensing members;
 an analog-to-digital converter electrically connected to the amplifier;
 a processing circuit electrically connected to the analog-to-digital converter;
 an input/output interface electrically connected to the processing circuit; and
 a control logic electrically connected to the fingerprint sensing members, the amplifier, the analog-to-digital converter, the processing circuit and the input/output interface, for controlling the fingerprint sensing members, the amplifier, the analog-to-digital converter, the processing circuit and the input/output interface to operate.

9. The apparatus according to claim 1, wherein a contact angle between the flat touch surface and water is greater than 60 degrees.

10. The apparatus according to claim 1, wherein a material of the protection layer has hydrophobic and lipophobic properties.

11. The apparatus according to claim 1, wherein a material of the protection layer comprises a nano-polymeric material or a ceramics material.

12. The apparatus according to claim 1, wherein a material of the protection layer comprises polyimide, epoxy resin or diamond-like carbon (DLC).

* * * * *